(12) United States Patent
Bergbauer et al.

(10) Patent No.: US 10,475,961 B2
(45) Date of Patent: Nov. 12, 2019

(54) OPTOELECTRONIC SEMICONDUCTOR CHIP

(71) Applicant: OSRAM Opto Semiconductors GmbH, Regensburg (DE)

(72) Inventors: Werner Bergbauer, Windberg (DE); Joachim Hertkorn, Wörth an der Donau (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 16/081,206

(22) PCT Filed: Jul. 18, 2017

(86) PCT No.: PCT/EP2017/068136
§ 371 (c)(1),
(2) Date: Aug. 30, 2018

(87) PCT Pub. No.: WO2018/015391
PCT Pub. Date: Jan. 25, 2018

(65) Prior Publication Data
US 2019/0081211 A1    Mar. 14, 2019

(30) Foreign Application Priority Data

Jul. 19, 2016 (DE) .................. 10 2016 113 274

(51) Int. Cl.
*H01L 33/00* (2010.01)
*H01L 33/32* (2010.01)
(Continued)

(52) U.S. Cl.
CPC ............ *H01L 33/325* (2013.01); *H01L 33/06* (2013.01); *H01L 33/02* (2013.01); *H01L 33/32* (2013.01)

(58) Field of Classification Search
CPC ....... H01L 33/325; H01L 33/06; H01L 33/02; H01L 33/32
(Continued)

(56) References Cited

U.S. PATENT DOCUMENTS 8,823,034 B2    9/2014   Bergbauer et al.
9,520,535 B2   12/2016   Park et al.
(Continued)

FOREIGN PATENT DOCUMENTS

DE    102010046792 A1    3/2012
DE    102012203583 A1    9/2013
(Continued)

*Primary Examiner* — Vu A Vu
(74) *Attorney, Agent, or Firm* — Slater Matsil, LLP

(57) ABSTRACT

An optoelectronic semiconductor chip is disclosed. In an embodiment an optoelectronic semiconductor chip includes a semiconductor layer sequence composed of AlInGaN comprising an n-conducting n-region, a p-conducting p-region and an intermediate active zone having at least one quantum well for generating a radiation, wherein the p-region comprises an electron barrier layer, a contact layer and an intermediate decomposition stop layer, the contact layer being directly adjacent to a contact metallization, wherein the decomposition stop layer comprises an aluminum content of at least 5% and at most 30% in places, wherein an intermediate region arranged between the electron barrier layer and the decomposition stop layer has a thickness between 2 nm and 15 nm inclusive, the intermediate region being free of aluminum, and wherein the aluminum content in the decomposition stop layer varies and increases on average in a direction towards the contact layer.

15 Claims, 3 Drawing Sheets

(51) Int. Cl.
*H01L 33/06* (2010.01)
*H01L 33/02* (2010.01)

(58) Field of Classification Search
USPC .......................................................... 257/79
See application file for complete search history.

(56) References Cited

U.S. PATENT DOCUMENTS

| | | |
|---|---|---|
| 9,553,231 B2 | 1/2017 | Meyer et al. |
| 2009/0283747 A1* | 11/2009 | Harwood .............. H01L 33/007 257/13 |
| 2011/0012088 A1* | 1/2011 | Strassburg .............. H01L 33/04 257/13 |
| 2013/0228743 A1* | 9/2013 | Fu ........................... H01L 33/06 257/13 |
| 2015/0034930 A1 | 2/2015 | Reusch et al. |
| 2015/0083994 A1* | 3/2015 | Jain ..................... H01L 33/0025 257/13 |
| 2015/0255672 A1 | 9/2015 | Shur et al. |
| 2015/0255685 A1 | 9/2015 | Herrmann et al. |
| 2016/0197235 A1* | 7/2016 | Sung ....................... H01L 33/32 257/76 |

FOREIGN PATENT DOCUMENTS

| | | |
|---|---|---|
| DE | 102012217533 A1 | 3/2014 |
| DE | 102013104351 A1 | 10/2014 |
| EP | 2988339 A2 | 2/2016 |
| WO | 2009096919 A1 | 8/2009 |
| WO | 2013191406 A1 | 12/2013 |

* cited by examiner

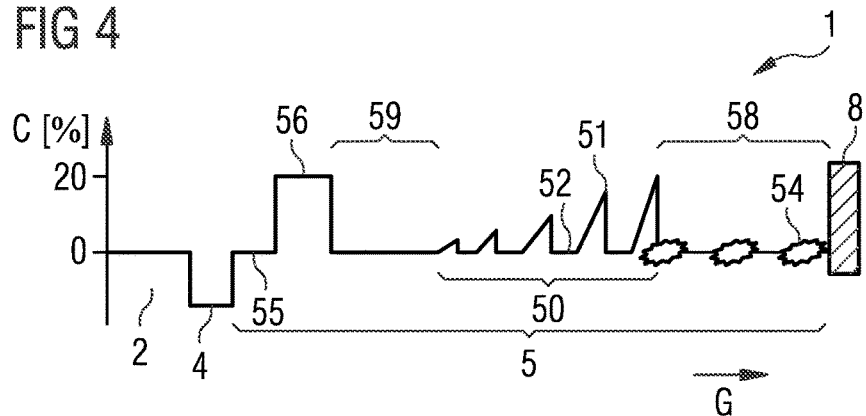
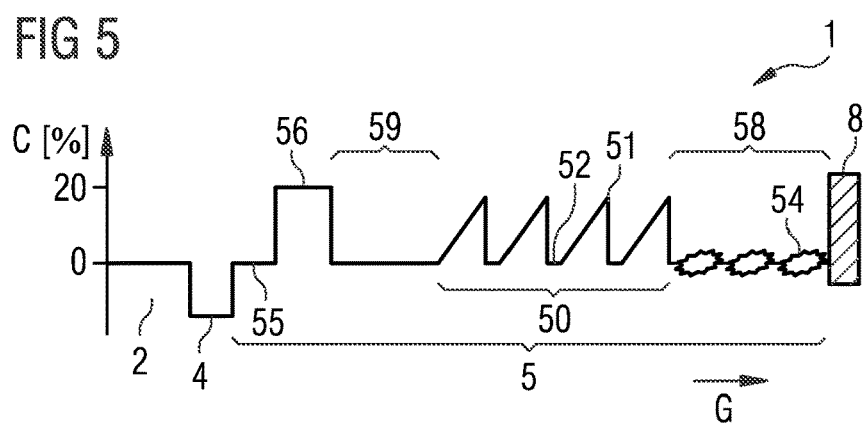
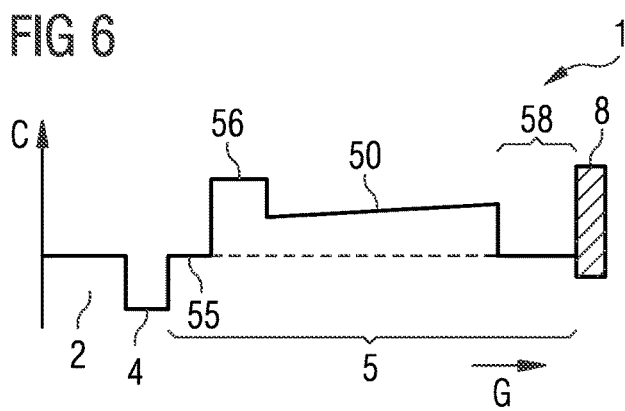
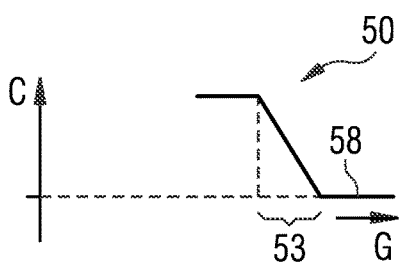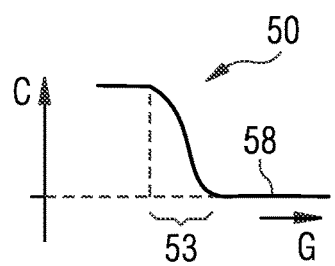

OPTOELECTRONIC SEMICONDUCTOR CHIP

This patent application is a national phase filing under section 371 of PCT/EP2017/068136, filed Jul. 18, 2017, which claims the priority of German patent application 10 2016 113 274.8, filed Jul. 19, 2016, each of which is incorporated herein by reference in its entirety.

TECHNICAL FIELD

An optoelectronic semiconductor chip is provided.

SUMMARY OF THE INVENTION

Embodiments provide an optoelectronic semiconductor chip which emits near-ultraviolet radiation and which has a long service life.

According to at least one embodiment, the optoelectronic semiconductor chip comprises a semiconductor layer sequence which can comprise a semiconductor material.

According to at least one embodiment, the semiconductor layer sequence has an n-conducting n-region. The n-region is continuously or at least predominantly n-doped, for example, with silicon and/or germanium. It is possible for thin, undoped layers to be located in the n-region. In this case, "thin" denotes in particular a thickness of at most 12 nm or 8 nm or 5 nm.

According to at least one embodiment, the semiconductor layer sequence comprises a p-conducting p-region. A p-type doping is produced in particular by magnesium or beryllium. As is also the case for the n-region, the p-region can be continuously p-doped or can comprise thin, undoped layers.

According to at least one embodiment, the semiconductor layer sequence comprises an active zone. The active zone is located between the n-region and the p-region and can directly adjoin the n-region and/or the p-region. One or more quantum wells and/or at least one pn junction are located in the active zone. The active zone is preferably a multi-quantum well structure having a plurality of quantum wells and barrier layers situated therebetween.

According to at least one embodiment, the active zone is designed to generate radiation. The radiation is in particular UVA radiation. A wavelength of maximum intensity of the radiation generated in the intended operation of the active zone is in particular at least 365 nm or 385 nm and/or at most 480 nm or 415 nm or 405 nm or 400 nm.

According to at least one embodiment, the active zone and the semiconductor layer sequence are designed to generate incoherent radiation. In other words, no laser radiation is generated. This means that the semiconductor layer sequence is designed as a light-emitting diode, LED for short. Thus, as intended, the semiconductor layer sequence is located within a light-emitting diode.

According to at least one embodiment, the semiconductor layer sequence is formed from the III-V compound semiconductor material $Al_nIn_{1-n-m}Ga_mN$, AlInGaN for short, and is based on this material, wherein $0 \leq n \leq 1$, $0 \leq m \leq 1$ and $n+m \leq 1$. If GaN is specified below as the material, then $n=0$ and $m=1$; in the case of AlGaN, $n+m=1$ applies, and $n=0$ applies for InGaN. However, the semiconductor layer sequence can have dopants. For the sake of simplicity, however, only the essential components of the crystal lattice of the semiconductor layer sequence are mentioned, that is Al, Ga, In and N, even if these can be partially replaced and/or supplemented by small quantities of further substances. Substances having a concentration of at most $5 \times 10^{16}$ $1/cm^3$ or $2 \times 10^{17}$ $1/cm^3$ are disregarded in the present case and/or only considered as impurities.

According to at least one embodiment, the p-region preferably comprises an electron barrier layer. The optional electron barrier layer is configured to stop and/or to set back or to reflect back electrons coming from the n-region towards the active zone.

According to at least one embodiment, the p-region comprises a contact layer. The contact layer is preferably highly doped. Furthermore, the contact layer directly adjoins a contact metallization which is provided for impressing current into the semiconductor layer sequence. The term "contact metallization" may include non-metallic materials which have an ohmic conductivity. For example, the contact metallization is partly formed by transparent conductive oxides, TCOs for short, such as ITO.

According to at least one embodiment, a decomposition stop layer is located between the electron barrier layer and the contact layer. The decomposition stop layer preferably directly adjoins the contact layer and can adjoin the electron barrier layer.

According to at least one embodiment, an aluminum content of at least 5% or 10% is present in the decomposition stop layer in places. Alternatively or additionally, the aluminum content in the decomposition stop layer, in particular for each partial layer, is at most 50% or 30% or 20%.

According to at least one embodiment, the aluminum content in the decomposition stop layer is varied; this means that the aluminum content changes across the decomposition stop layer. In particular, a change in the aluminum content across the decomposition stop layer is at least 20% or 50% or 80%, relative to a maximum aluminum content in the decomposition stop layer. If, for example, the maximum aluminum content is 25% and the change in the aluminum content is 50%, thus, the aluminum content is at most 12.5% in places.

In at least one embodiment, the optoelectronic semiconductor chip comprises a semiconductor layer sequence composed of AlInGaN. The semiconductor layer sequence comprises an n-conducting n-region, a p-conducting p-region and an intermediate active zone having at least one quantum well for generating radiation. The p-region comprises an electron barrier layer, a contact layer and an intermediate decomposition stop layer. The contact layer directly adjoins a contact metallization, in particular an anode, of the semiconductor chip. In the decomposition stop layer, an aluminum content of at least 5% and at most 30% is present in places. The aluminum content is varied in the decomposition stop layer.

In optoelectronic components based on nitride compound semiconductors, the decomposition of p-doped gallium nitride occurs under certain conditions. Such a decomposition process can be observed, for example, with an electric field applied in the forward direction, in interaction with a reactive metal such as gold. Such a decomposition process is also intensified in the presence of ultraviolet radiation and at elevated temperatures. The presence of oxygen can lead to the formation of GaO and thus to damage to GaN. Harmful influences on silver are likewise possible by the formation of AgO.

One possibility for avoiding or at least delaying the decomposition of the p-GaN is to arrange a contact metallization as far away as possible from the active zone so that an interface between the metal of the contact metallization and the contact layer is far away from the quantum wells. In particular in the case of parasitic traces of gold or of other catalytically active elements on the contact metallization, however, there is no sufficient protection against such decompositions.

By means of the decomposition stop layer described here, which contains aluminum, a barrier layer against the migration of reactive metal ions, in particular gold, is achieved. The service life of the semiconductor chip can thus be increased, which is true in particular when generating near ultraviolet radiation in the active zone and at elevated operating temperatures of, for example, at least 100° C., of the active zone.

According to at least one embodiment, the aluminum content in the decomposition stop layer increases in the direction towards the contact layer on average. This does not exclude that the aluminum content is modulated. However, an increasing tendency of the aluminum content, for example, averaged over larger areas, is present towards the contact layer.

According to at least one embodiment, the decomposition stop layer has a plurality of first partial layers. The first partial layers are formed from AlGaN. It is possible for the same aluminum content to be present in all the first partial layers or that different first partial layers have different aluminum contents. The first partial layers are preferably doped, but can also be undoped.

According to at least one embodiment, the decomposition stop layer comprises a plurality of second partial layers. The second partial layers are preferably produced from GaN and are preferably p-doped. The first partial layers and the second partial layers are arranged alternatingly in the decomposition stop layer. The first and the second partial layers preferably directly follow one another.

According to at least one embodiment, the aluminum content is constant within each of the first partial layers. This means that no variation of the aluminum content takes place within the first partial layers.

According to at least one embodiment, the aluminum content within the first partial layers is varied. This means that the aluminum content changes in a targeted manner within each of the first partial layers or within at least some of the first partial layers. In particular, the aluminum content increases in regions or over the entire corresponding first partial layer in the direction towards the contact layer, in particular strictly monotonically or monotonically.

According to at least one embodiment, the aluminum content in the decomposition stop layer increases in the direction towards the contact layer, seen over a plurality of first partial layers. This is in particular associated with the fact that the respective first partial layers have different aluminum contents or average aluminum contents. Within the respective first partial layer, the aluminum content can be constant or can additionally be varied. It is thus possible for a double variation of the aluminum content to be present, on the one hand within the respective first partial layer and on the other hand over a plurality of the first partial layers.

According to at least one embodiment, all of the first partial layers are of the same design, within the scope of the production tolerances. This preferably also applies to the second partial layers made of p-GaN.

According to at least one embodiment, at least three or four and/or at most twelve or eight or six of the first partial layers are present. In other words, a comparatively small number of first partial layers are present. In particular, no superlattice is formed. The number of second partial layers preferably corresponds to the number of first partial layers or is reduced by one compared to the number of first partial layers.

According to at least one embodiment, the aluminum content in the decomposition stop layer increases monotonically or strictly monotonically in the direction towards the contact layer. In other words, the aluminum content then does not decrease in the direction towards the contact layer at any point. For example, the aluminum content runs in a ramp-shaped and/or linearly rising manner towards the contact layer.

According to at least one embodiment, the aluminum content in the decomposition stop layer is designed such that it decreases in a transition region in the direction towards the contact layer. In particular, a gradual, that is to say continuous and/or contiguous decrease or even a stepped decrease in the aluminum content can be present. In this case, the transition region preferably adjoins the contact layer directly. If a plurality of the first partial layers are present in the decomposition stop layer, then it is possible that each of the first partial layers or a plurality of the first partial layers is provided with such a transition region. Particularly preferably, however, such a transition region is present only on the first partial layer closest to the contact layer.

According to at least one embodiment, an intermediate region is located between the electron barrier layer and the decomposition stop layer. The intermediate region is preferably of p-doped GaN.

According to at least one embodiment, the decomposition stop layer has a thickness of at least 2 nm or 5 nm or 15 nm or 30 nm. Alternatively or additionally, the thickness of the decomposition stop layer is at most 70 nm or 60 nm or 30 nm or 15 nm.

According to at least one embodiment, the intermediate region is free of aluminum. The decomposition stop layer is thus in particular a region in which aluminum is present for the first time from the electron barrier layer in the direction towards the contact layer, wherein the decomposition stop layer extends to the point where aluminum is still present last before the contact layer.

According to at least one embodiment, an overall thickness of the decomposition stop layer and/or a thickness of the decomposition stop layer together with the intermediate region is at least 30 nm or 50 nm. Alternatively or additionally, this thickness is at most 150 nm or 120 nm or 90 nm. By such a thickness, the active zone can be operated in resonance with the contact metallization, preferably using the Purcell effect.

According to at least one embodiment, the contact metallization has a small proportion of impurities, for example, metallic impurities such as gold. For example, a proportion by weight of the impurities, especially of metals and in particular of gold, at the contact metallization is at least $10^{-9}$ or $10^{-7}$ or $10^{-5}$. Preferably, the proportion by weight of the impurities, in particular of gold, at the contact metallization is at most $10^{-3}$ or $10^{-4}$.

According to at least one embodiment, the contact metallization comprises one or more of the materials mentioned below or consists of one or more of these materials, ignoring impurities: Ag, Al, ITO, Pt, Rh, Ti, ZnO.

According to at least one embodiment, the contact layer is a GaN layer which is highly doped. A dopant concentration, in particular of magnesium or beryllium, is preferably at least $1\times10^{20}$ 1/cm$^3$ and/or at most $1\times10^{21}$ 1/cm$^3$.

According to at least one embodiment, a thickness of the contact layer is at least 3 nm or 5 nm or 7 nm. Alternatively or additionally, the contact layer has a thickness of at most 40 nm or 25 nm or 15 nm. The contact layer is preferably composed of no partial layers, but is formed as intended by a single layer. In addition to gallium and nitrogen, it is possible for the contact layer to contain small amounts of oxygen. Instead of a GaN contact layer, an InGaN contact layer or an InN contact layer can also be used.

BRIEF DESCRIPTION OF THE DRAWINGS

An optoelectronic semiconductor chip described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the Figures:

FIGS. 1 to 6 show schematic sectional representations of exemplary embodiments of optoelectronic semiconductor chips;

FIGS. 7A and 7B show schematic sectional representations of transition regions between decomposition stop layers and contact layers;

DETAILED DESCRIPTION OF ILLUSTRATIVE EMBODIMENTS

Figure 1:
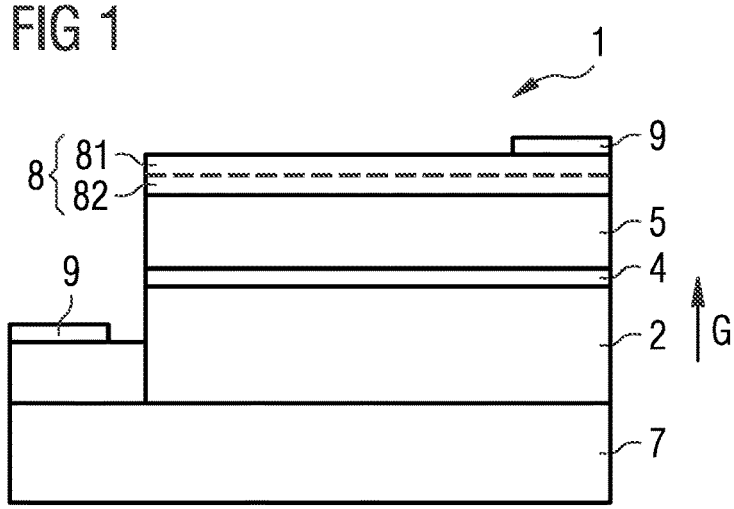

FIG. 1 shows an exemplary embodiment of an optoelectronic semiconductor chip 1. The semiconductor chip 1 comprises a semiconductor layer sequence which contains an n-conducting n-region 2, a p-conducting p-region 5 and an intermediate active zone 4. The active zone 4 is preferably a multi-quantum well structure. The semiconductor layer sequence 2, 4, 5 is located in particular on a carrier 7, which can be a growth substrate for the semiconductor layer sequence.

Along a growth direction G of the semiconductor layer sequence 2, 4, 5, a contact metallization 8 is attached to a side of the p-region 5 facing away from the active zone 4. The contact metallization 8 can be composed of a TCO layer 82 directly on the p-region 5 and of a metal layer 81 or a metal layer stack. In this case, the TCO layer 82 is optional. The contact metallization 8 is preferably designed as a mirror for radiation generated in the active zone 4 during operation. Radiation is preferably coupled out through the optional carrier 7. The semiconductor chip 1 is electrically contacted via two connection surfaces 9 on the n-region 2 and on the contact metallization 8.

The semiconductor layer sequence is explained in more detail in FIGS. 2 to 7, in particular the p-region 5, which is located directly between the active zone 4 and the contact metallization 8. Subsequently, the contact metallization 8 is drawn only as one layer, but can in each case be constructed as illustrated in FIG. 1.

Figure 2:
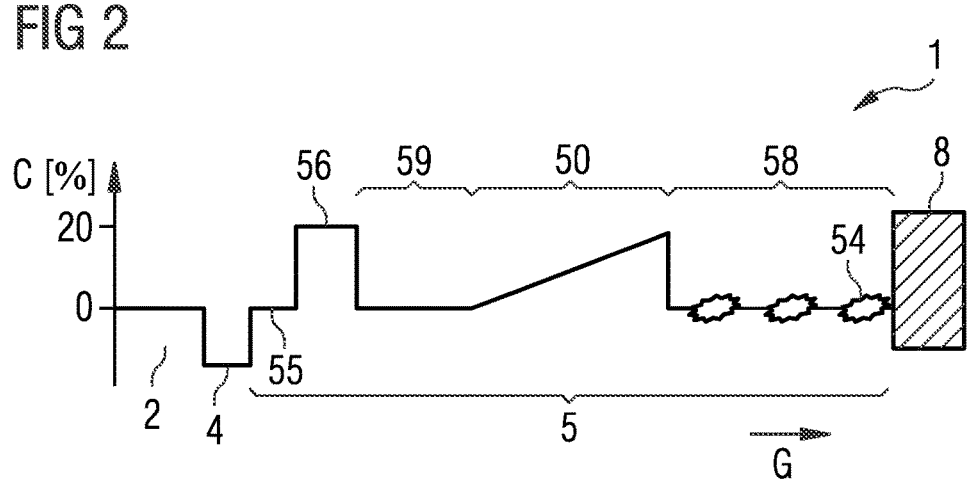

According to FIG. 2, along the growth direction G the p-region 5 comprises a spacer layer 55, an electron barrier layer 56, an intermediate region 59, a decomposition stop layer 50 and a contact layer 58. Said layers preferably follow one another directly in the specified sequence. The electron barrier layer 56 is optional, as in all other exemplary embodiments.

The spacer layer 55 is preferably a GaN layer, for example, with a thickness of 5 nm to 10 nm, in particular approximately 7 nm. The electron barrier layer 56 is preferably formed of AlGaN having an aluminum content of, for example, between 20% and 30%; optionally, the electron barrier layer 56 can also contain indium and thus can be composed of AlInGaN, preferably with an indium content of at most 2%. A thickness of the electron barrier layer 56 is preferably at least 2 nm or 5 nm and/or at most 14 nm or 10 nm. Unlike illustrated, the electron barrier layer 56 can also be composed of several, in particular three, partial layers. The electron barrier layer 56 is preferably p-doped in its entirety or at least in regions, but can begin undoped in particular in the direction of the active zone and/or can be increasingly doped in the direction towards the p-contact layer 58. Alternatively, the electron barrier layer is undoped.

The intermediate layer 59 is formed from GaN and is preferably undoped. The intermediate layer 59 can be more highly doped than the decomposition stop layer 50, for example, with a dopant concentration of approximately $10^{18}$ $1/cm^3$ to $10^{20}$ $1/cm^3$.

The decomposition stop layer 50 is formed from AlGaN. An aluminum content C increases in the direction of the contact metallization 8 and thus along the growth direction G; the aluminum content C is schematically plotted in percent relative to the growth direction G in FIG. 2. In the decomposition stop layer 50, the aluminum content C is thus varied in the form of a triangular ramp. For example, the aluminum content C can be adjusted from 0% to an end value, for example, 10%, over a distance of at least 10 nm or 20 nm or 30 nm and/or of at most 55 nm or 35 nm or 15 nm, in particular linearly rising.

A maximum aluminum content of the decomposition stop layer 50 is preferably below a maximum aluminum content of the electron barrier layer 56, as can also be the case in all other exemplary embodiments.

Towards the contact layer 58, the aluminum content C of the decomposition stop layer 50 preferably returns abruptly and directly to zero. A sudden reduction of the aluminum content C thus takes place towards the contact layer 58. In the representation of FIG. 2, negative aluminum contents C can be interpreted as regions with indium.

The contact layer 58 is formed from highly p-doped GaN, a dopant concentration with magnesium is preferably between $1 \times 10^{20}$ $1/cm^3$ and $2 \times 10^{20}$ $1/cm^3$. The contact layer 58 has a relatively small thickness of at least 5 nm to at most 30 nm, in particular approximately 20 nm.

By heat generation during operation of the semiconductor chip 1, by means of the ultraviolet radiation generated in the active zone 4 and as a result of the influence of metal ions from the contact metallization 8, damage 54 can arise in the p-region 5. The damage 54 can continue over the operating duration of the semiconductor chip 1 in the direction towards the active zone 4. The decomposition stop layer 50 ensures that said damage 54 does not move further towards the active zone 4. This prevents further damage and thus a failure of the semiconductor chip 1 by the decomposition stop layer 50.

A total thickness of the p-region 5 is preferably in the range of 90 nm. Thus, it can be achieved that the active zone lies in an intensity maximum of the generated radiation using the Purcell effect. The active zone 4 is then arranged resonant to the contact metallization 8, which is enabled by the thicknesses, in particular of the intermediate region 59 and of the decomposition stop layer 50.

Figure 3:
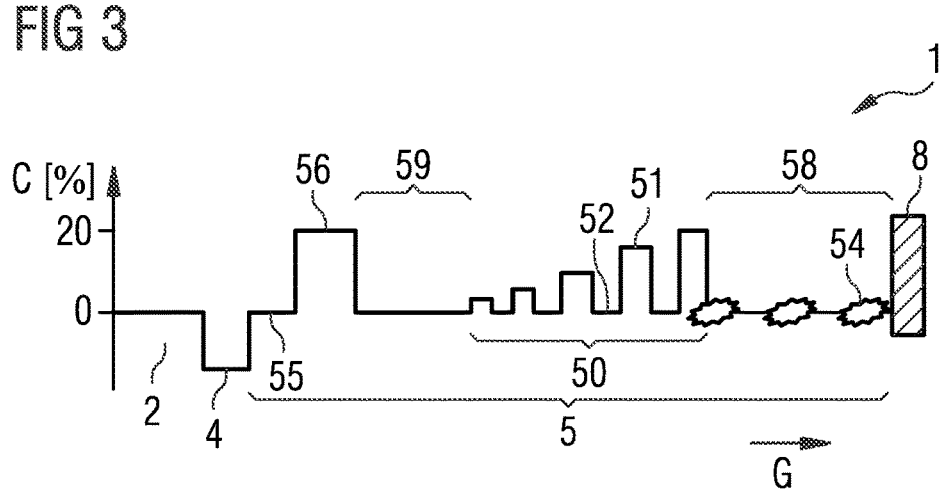

In the exemplary embodiment of FIG. 3, the decomposition stop layer 50 is composed of first partial layers 51 of AlGaN and of second partial layers 52 made of GaN. The first partial layers 51 are preferably undoped, and the second partial layers 52 are preferably doped. Alternatively, the doping is at least modulated so that a lower dopant concentration is present in the second partial layers 52 than in the first partial layers 51; for example, the dopant concentration is on average by at least a factor of 2 or 5 lower in the second partial regions 52.

Within the respective partial layers 51, 52, a material composition is constant or approximately constant. The aluminum content C increases from first partial layer 51 to first partial layer 51 in the direction towards the contact layer 58. In this case, the first partial layers 51 can each have the same thickness. Alternatively, it is possible for centrally located first partial layers 51 to have a greater thickness than marginal first partial layers 51. The second partial layers 52 are preferably all of the same thickness. Thus, by means of the, for example, five first partial layers 51, a gradual increase of the aluminum content C is realized.

The first partial layers 51 preferably each have a thickness of at least 1.5 nm or 2 nm or 4 nm and/or of at most 12 nm or 8 nm or 6 nm or 5 nm. A thickness of the second partial layers 52 is preferably at least 2 nm or 4 nm and/or at most 8 nm or 6 nm. Moreover, preferably the thickness of the intermediate region 59 is at least the thickness of quantum wells in the active zone 4. In particular, the intermediate region 59 has a thickness of at least 3 nm or 5 nm. This also applies to all other exemplary embodiments.

Otherwise, the exemplary embodiment of FIG. 3 corresponds to that of FIG. 2.

According to FIG. 4, the aluminum content C increases in the direction towards the contact layer 58 in each of the first partial layers 51. A triangular profile with regard to the aluminum content C is thus present within the first partial layers 51. In this case, the aluminum content C preferably falls rapidly on sides of the first partial layers 51 facing the contact layer 58 so that the aluminum content C in the drawing runs perpendicular or approximately perpendicular to the growth direction.

As in FIG. 3, the aluminum content C increases in the direction towards the contact layer 58 over a plurality of the first partial layers 51. Otherwise, the description relating to FIG. 2 applies accordingly.

In the exemplary embodiment of FIG. 5, four first partial layers 51 are present. In each of the first partial layers 51, in the direction towards the contact layer 58 the aluminum content C increases in a uniform, triangular manner. All first partial layers 51 are configured in the same way.

Unlike in FIGS. 3 to 5, it is alternatively possible that the second partial layers 52 can be omitted. In addition, in contrast to the representations in particular in FIGS. 2, 4 and 5 it is possible that the variation of the aluminum content C does not take place gradually, but in steps, for example, in at least two or four or six individual steps.

According to FIGS. 2 to 5, the intermediate region 59 has a relatively large thickness. For example, the thickness of the intermediate region 59 in these exemplary embodiments is in each case at least 40% or 60% and/or at most 70% or 50% or 30% of the thickness of the decomposition stop layer 50.

In contrast, no intermediate region is present in FIG. 6. The decomposition stop layer 50 begins directly on the electron barrier layer 56 with a relatively low aluminum content C. Proceeding from the electron barrier layer 56, the aluminum content C in the decomposition stop layer 50 increases slowly in a continuous manner or, in contrast to the representation, in a step-like manner. However, the aluminum content C of the electron barrier layer 56 is preferably not reached in the decomposition stop layer 50. An increase in the aluminum content C is, for example, at least 0.5 percentage points per 10 nm and/or at most 3 percentage points per 10 nm.

FIG. 7, collectively 7A and 7B, shows that a transition region 53 is present directly between the decomposition stop layer 50 and the contact layer 58. In the transition region 53, the aluminum content C decreases gradually, wherein, as an alternative to the representation, a stepped reduction is also possible. The decrease according to FIG. 7A takes place linearly and according to FIG. 7B sinusoidally.

Such a transition region 53 can also be present in the decomposition stop layers 50 of FIGS. 2 to 6. If such a transition region 53 is present in the exemplary embodiments of FIGS. 3 to 5, this is preferably the case only for the first partial layer 51 located closest to the contact layer 58, or, less preferred, even in the case of all first partial layers 51.

Figure 8:
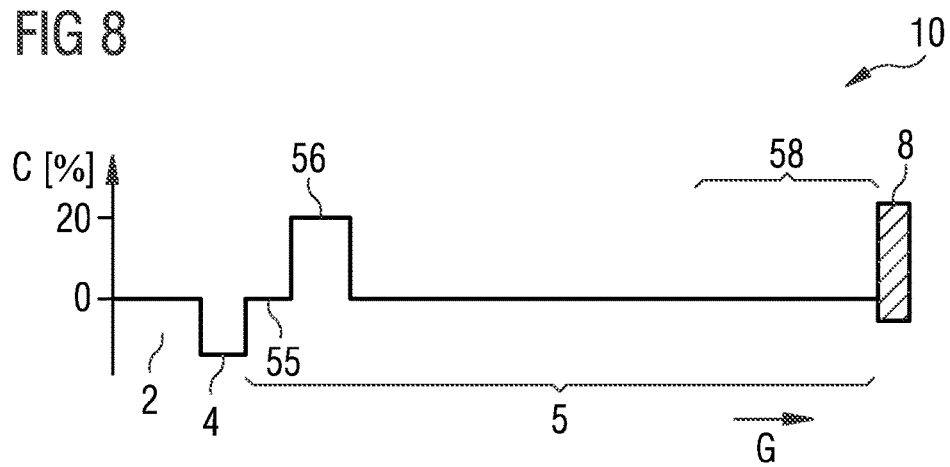
FIGS. 8 and 10 show schematic sectional representations of modifications of semiconductor chips.

In the modification 10 according to FIG. 8, no decomposition stop layer is present. Thus, damages can proceed from the contact metallization 8 to the electron barrier layer 56 and due to the small thickness of the electron barrier layer 56 can also propagate into the nearby active zone 4. Thus, in the modification 10 of FIG. 8, there is an increased risk of destruction and/or of a shortened service life.

Figure 9:
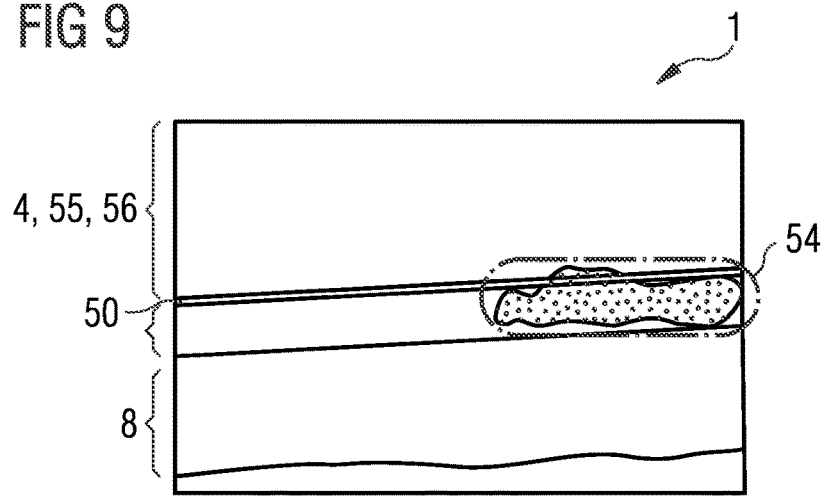
FIG. 9 shows an FIB image of an exemplary embodiment of an optoelectronic semiconductor chip.

FIG. 9 illustrates an FIB representation of a further exemplary embodiment of the semiconductor chip 1. FIB stands for Focused Ion Beam.

In the right-hand half of FIG. 9 it can be seen that, proceeding from the contact metallization 8, a damage 54 propagates towards the active zone 4. Said damage 54 occurs randomly locally on the contact metallization 8. As can be seen in FIG. 9, the damage 54 stops on the decomposition stop layer 50.

Figure 10:
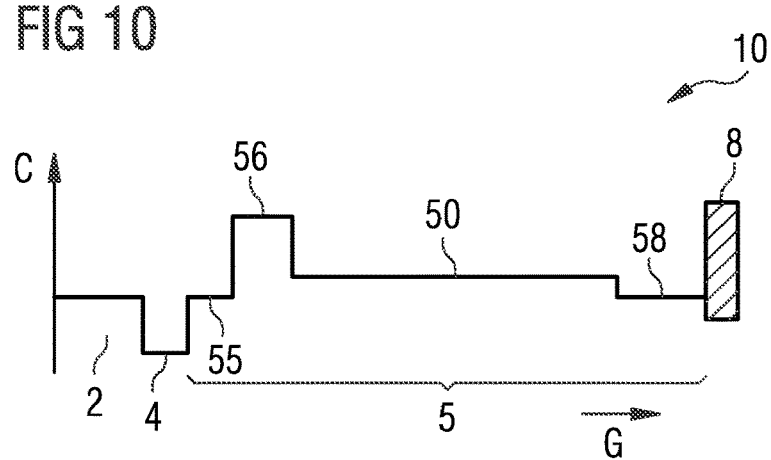

In the alternative configuration of FIG. 10, between the electron barrier layer 56 and the contact layer 58 a wide region with a relatively low, constant aluminum content C of at most $10^{20}$ 1/cm$^3$ is present.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An optoelectronic semiconductor chip comprising:
   a semiconductor layer sequence composed of AlInGaN comprising an n-conducting n-region, a p-conducting p-region and an intermediate active zone having at least one quantum well for generating a radiation,
   wherein the p-region comprises an electron barrier layer, a contact layer and an intermediate decomposition stop layer, the contact layer being directly adjacent to a contact metallization,
   wherein the decomposition stop layer comprises an aluminum content of at least 5% and at most 30% in places,
   wherein an intermediate region arranged between the electron barrier layer and the decomposition stop layer has a thickness between 2 nm and 15 nm inclusive, the intermediate region being free of aluminum,
   wherein the aluminum content in the decomposition stop layer varies and increases on average in a direction towards the contact layer,
   wherein at least one of a thickness of the decomposition stop layer or a thickness of the decomposition stop layer together with the intermediate region is between 30 nm and 120 nm inclusive, and
   wherein the decomposition stop layer comprises a plurality of first partial layers composed of AlGaN and a plurality of second partial layers composed of GaN, the first and second partial layers alternating with one another.

2. The optoelectronic semiconductor chip according to claim 1, wherein the aluminum content is constant within the first partial layers.

3. The optoelectronic semiconductor chip according to claim 1, wherein the aluminum content varies within the first partial layers and increases at least in regions in the direction towards the contact layer.

4. The optoelectronic semiconductor chip according to claim 1, wherein the aluminum content of the plurality of the first partial layers in the decomposition stop layer increases in the direction towards the contact layer.

5. The optoelectronic semiconductor chip according to claim 1, wherein all the first partial layers are of the same design.

6. The optoelectronic semiconductor chip according to claim 1, wherein at least three and at most eight of the first partial layers are present.

7. The optoelectronic semiconductor chip according to claim 1, wherein the aluminum content in a transition region of the decomposition stop layer decreases gradually in the direction towards the contact layer.

8. The optoelectronic semiconductor chip according to claim 1, wherein the contact metallization comprises gold with a weight proportion of at least $10^{-7}$.

9. The optoelectronic semiconductor chip according to claim 1, wherein the contact metallization comprises Ag, Al, ITO, Pt or ZnO.

10. The optoelectronic semiconductor chip according to claim 1,
wherein the active zone is capable of generating radiation having a wavelength of a maximum intensity between 365 nm and 405 nm inclusive,
wherein the radiation is incoherent radiation, and
wherein the semiconductor chip is a light-emitting diode.

11. The optoelectronic semiconductor chip according to claim 1, wherein the contact layer is composed of GaN, has a thickness between 3 nm and 25 nm inclusive, and is doped with magnesium with a dopant concentration between $1\times10^{20}$ 1/cm$^3$ and $1\times10^{21}$ 1/cm$^3$.

12. An optoelectronic semiconductor chip comprising:
a semiconductor layer sequence composed of AlInGaN comprising an n-conducting n-region, a p-conducting p-region and an intermediate active zone having at least one quantum well for generating a radiation,
wherein the p-region comprises an electron barrier layer, a contact layer and an intermediate decomposition stop layer, the contact layer being directly adjacent to a contact metallization,
wherein the decomposition stop layer comprises an aluminum content of at least 5% and at most 30% in places,
wherein the aluminum content in the decomposition stop layer varies, and
wherein a thickness of the decomposition stop layer is in total between 30 nm and 150 nm inclusive so that the active zone is operable in resonance with the contact metallization.

13. The optoelectronic semiconductor chip according to claim 12,
wherein an intermediate region between the electron barrier layer and the decomposition stop layer has a thickness between 2 nm and 15 nm inclusive, and
wherein the intermediate region is free of aluminum.

14. An optoelectronic semiconductor chip comprising:
a semiconductor layer sequence composed of AlInGaN comprising an n-conducting n-region, a p-conducting p-region and an intermediate active zone having at least one quantum well for generating a radiation,
wherein the p-region comprises an electron barrier layer, a contact layer and an intermediate decomposition stop layer, the contact layer being directly adjacent to a contact metallization,
wherein the decomposition stop layer comprises an aluminum content of at least 5% and at most 30% in places,
wherein an intermediate region arranged between the electron barrier layer and the decomposition stop layer has a thickness between 2 nm and 15 nm inclusive, the intermediate region being free of aluminum,
wherein the aluminum content in the decomposition stop layer varies and increases on average in a direction towards the contact layer,
wherein at least one of a thickness of the decomposition stop layer or a thickness of the decomposition stop layer together with the intermediate region is between 30 nm and 120 nm inclusive, and
wherein the aluminum content in a transition region of the decomposition stop layer decreases in a stepwise manner in the direction towards the contact layer.

15. The optoelectronic semiconductor chip according to claim 14, wherein the aluminum content in the decomposition stop layer increases monotonically in the direction towards the contact layer.

* * * * *